United States Patent [19]

Fang

[11] Patent Number: 5,034,591
[45] Date of Patent: Jul. 23, 1991

[54] TAPE AUTOMATED BONDING LEADS HAVING A STIFFENER AND A METHOD OF BONDING WITH SAME

[75] Inventor: Jolson K. Fang, Sunnyvale, Calif.

[73] Assignee: Amdahl Corporation, Sunnyvale, Calif.

[21] Appl. No.: 455,919

[22] Filed: Dec. 21, 1989

Related U.S. Application Data

[63] Continuation of Ser. No. 171,828, Mar. 22, 1988, abandoned.

[51] Int. Cl.⁵ .................. B23K 26/14; H01R 27/00; H01L 23/48; H01L 23/02
[52] U.S. Cl. .................. 219/121.69; 219/121.67; 29/827; 437/220; 357/70; 174/52.4
[58] Field of Search .................. 357/70; 29/827; 437/220; 219/121.67, 121.69; 174/52.4

[56] References Cited

U.S. PATENT DOCUMENTS

| | | | |
|---|---|---|---|
| 3,444,441 | 5/1969 | Helda et al. | 357/70 |
| 3,611,061 | 10/1971 | Segerson | 357/70 |
| 4,137,546 | 1/1979 | Frusco | 357/70 |
| 4,204,317 | 5/1980 | Winn | 29/827 |
| 4,380,042 | 4/1983 | Angelucci, Sr. et al. | 361/421 |
| 4,551,912 | 11/1985 | Marks et al. | 437/19 |
| 4,554,404 | 11/1985 | Gilder, Jr. et al. | 357/70 |
| 4,663,650 | 5/1987 | Gilder, Jr. et al. | 357/70 |
| 4,733,292 | 3/1988 | Jarvis | 357/70 |
| 4,743,956 | 5/1988 | Olla et al. | 357/70 |

FOREIGN PATENT DOCUMENTS 0014451  1/1987  Japan .................. 357/70

Primary Examiner—Eugene R. Laroche
Assistant Examiner—Michael B. Shingleton
Attorney, Agent, or Firm—Fliesler, Dubb Meyer & Lovejoy

[57] ABSTRACT

An improved lead structure for tape automated bonding includes a stiffener which is an integral part of the leads. The stiffener maintains the alignment and spacing of the leads during fabrication and subsequent processing, e.g., bonding to a semiconductor chip. A laser is used to remove (or excise) the stiffener from the leads by cutting the leads individually or in groups. Several methods may be used to protect the semiconductor chip during excising, including focussing the beam so that the spot diameter at the focal point of the beam is less than one third of the distance between the focal point and the semiconductor device, providing a protective (e.g., reflective) coating on the semiconductor chip, or providing the laser beam with a shallow depth of field so that the beam is diverged at the surface of the semiconductor chip.

15 Claims, 3 Drawing Sheets

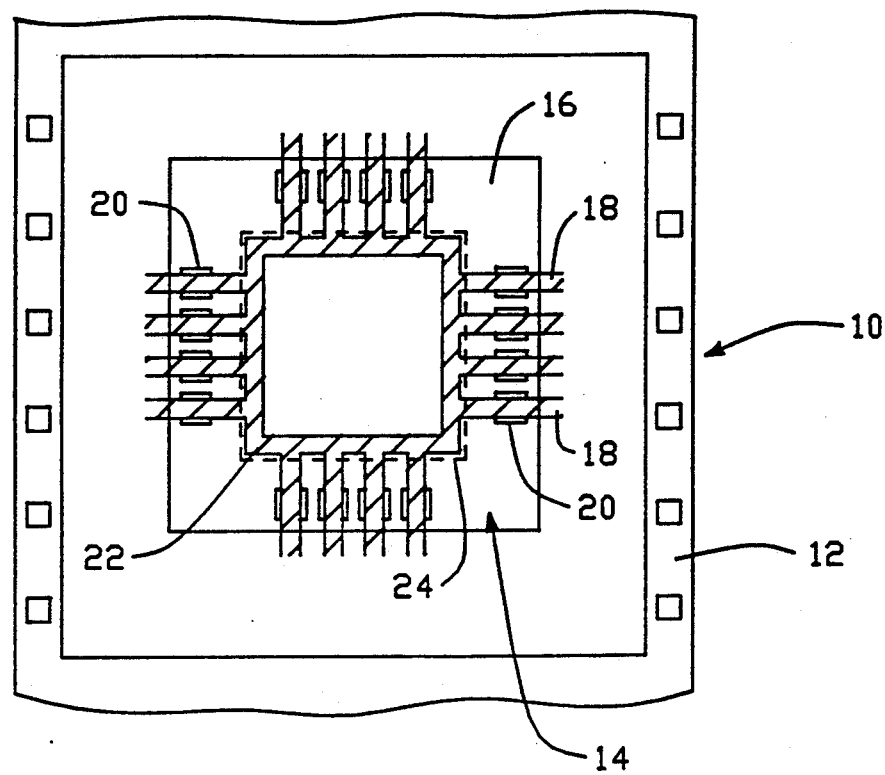
FIG.—1
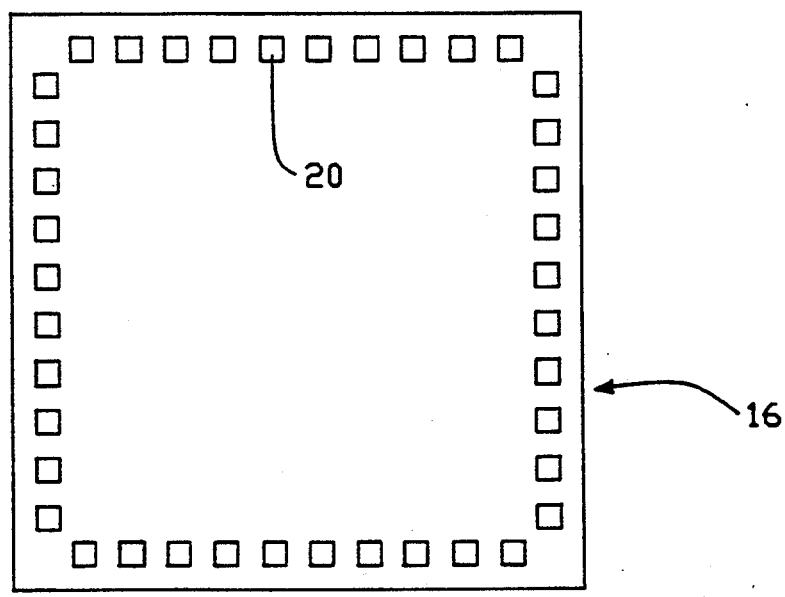
FIG.—2

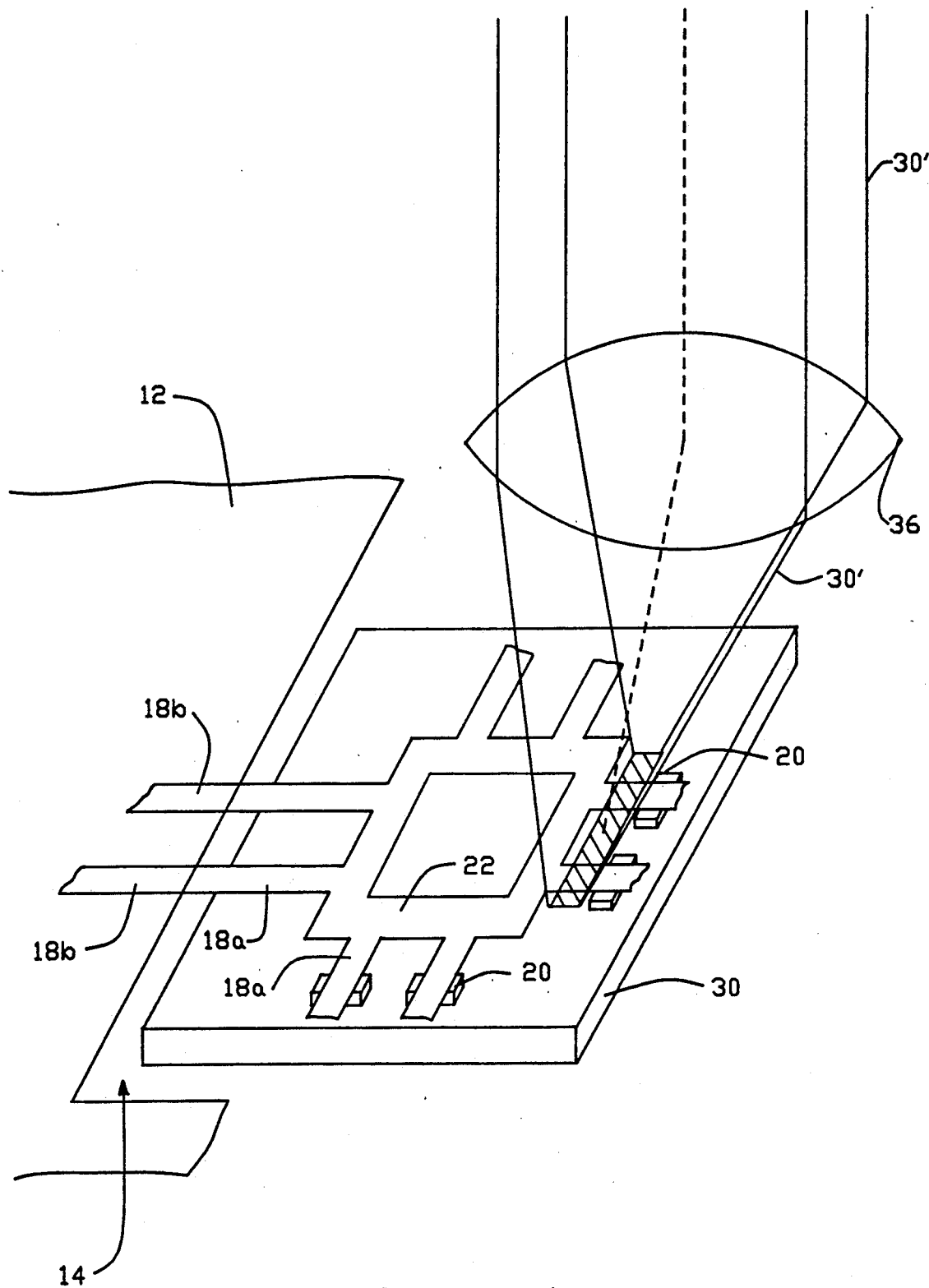
FIG.—4

TAPE AUTOMATED BONDING LEADS HAVING A STIFFENER AND A METHOD OF BONDING WITH SAME

"This application is a continuation of Ser. No. 171,828, filed Mar. 22, 1988 now abandoned."

BACKGROUND OF THE INVENTION

1. Field of the Invention

The present invention relates to tape automated bonding.

2. Description of the Related Art

Tape automated bonding is well known in the semiconductor industry. In conventional tape automated bonding leads, which are intended to be attached to a semiconductor chip prior to packaging the chip, are provided on a film similar to 35 mm photographic film by photolithography. The leads extend into an aperture at the center of each "frame" of the film, each frame having leads for one semiconductor chip. For example, a frame for a square chip has a square aperture and the leads extend into the aperture from all four sides of the aperture. The leads are formed of copper and are tinned so that they may be attached to solder bumps (or pads) on the chip by, e.g., reflow soldering. After the leads are attached to the chip, the leads and the chip are removed from the tape for packaging; the packaging may be plastic or ceramic encapsulation.

Advances in semiconductor manufacturing techniques have led to the ability to provide a significantly increased number of semiconductor devices per unit area. Thus, a chip of a given size has more devices and consequently more pads to which leads must be attached. When tape automated bonding is utilized to attach leads, the pads are provided around the periphery of the chip; accordingly, increasing the number of pads reduces the spacing or pitch of the pads.

As the pitch of leads for tape automated bonding is decreased, the leads must have a reduced cross-sectional area, and thus are more fragile. For dimensions currently used and for reduced dimensions of future semiconductor devices, the leads are so fragile that the processing steps utilized to fabricate the leads and subsequent handling can bend or otherwise damage the leads. Such bending or damage to the leads results in misalignment of the leads and the pads during bonding, thus making bonding difficult or impossible. The result is low yield. Conventional tape automated bonding uses approximately 300 leads/die for an 8 mm×8 mm die, and can be extended to 400 leads/die. However, with this number of leads per die and the lead size necessary (each lead has a minimum width of approximately 50 $\mu$m) to achieve same, damage to the leads during fabrication and bonding causes too many losses. With conventional tape automated bonding the minimum lead width is 50 $\mu$m and the minimum pitch is also 100 $\mu$m.

SUMMARY OF THE INVENTION

It is, therefore, an object of the present invention to provide a lead structure for tape automated bonding which is resistant to deformation.

A further object of the present invention is to provide a method of tape automated bonding utilizing a lead structure which is resistant to deformation.

Another object of the present invention is to provide a lead structure which allows the use of tape automated bonding leads having a greatly decreased pitch and lead width.

Another object of the present invention is to provide a lead structure for tape automated bonding having an integral stiffener.

Another object of the present invention is to provide a lead structure for tape automated bonding having greater than 400 leads per die.

Another object of the present invention is to provide a method of tape automated bonding utilizing a lead structure having an integral stiffener, including the removal of the stiffener.

An improved lead structure for tape automated bonding according to the present invention includes a tape (or film) having an aperture, leads provided on the tape and extending into the aperture, and a stiffener which is an integral part of the leads. The leads and the stiffener are formed by standard photolithographic techniques and the stiffener serves to maintain the spacing and alignment of the leads during the fabrication process.

A method of tape automated bonding according to the present invention includes the steps of providing a tape having an aperture, leads extending into the aperture and a stiffener attached to the portion of the leads extending into the aperture is provided, bonding the leads to a semiconductor device, and removing the stiffener. The stiffener may be removed by laser excising—i.e., cutting the leads with a laser beam. In order to prevent damage to the semiconductor device, the beam may be focussed by a high power lens producing a small depth of field; thus, the beam will be diverged and its power density decreased in the distance between the lead and the chip. In particular, the depth of field (the region in which the beam is focussed) is known to be three times the diameter of the beam at its focal point (spot diameter), and thus the spot diameter is selected so that the depth of field is smaller than the distance from the top of the lead to the chip. Further, the wavelength of the laser is selected so that the laser radiation is more readily absorbed by the leads than by the material of the semiconductor device. Another means of protecting the semiconductor device is to provide a coating on the semiconductor device which reflects the laser radiation.

The lead structure of the present invention has the advantage that leads having a decreased pitch, and thus a smaller cross-sectional area, can be utilized without a reduction in alignment accuracy. In particular, utilizing the subject invention in conjunction with conventional photolithographic techniques, lead widths on the order of 25 $\mu$m and pitches on the order of 50 $\mu$m can be achieved. Accordingly, 600–800 leads could be provided on an 8×8 mm die. Thus, tape automated bonding can be performed with chips having a much higher density of pads than was previously possible. The laser excising method removes the stiffener without damaging the chip.

BRIEF DESCRIPTION OF THE DRAWINGS

FIG. 1 is a top view of an improved lead structure for tape automated bonding in accordance with the present invention;

FIG. 2 is a top view of a chip to be bonded to the improved lead structure;

FIG. 4 is an isometric view of a chip bonded to the improved lead structure for explaining a second laser excising method.

DESCRIPTION OF THE PREFERRED EMBODIMENTS

Figure 3:
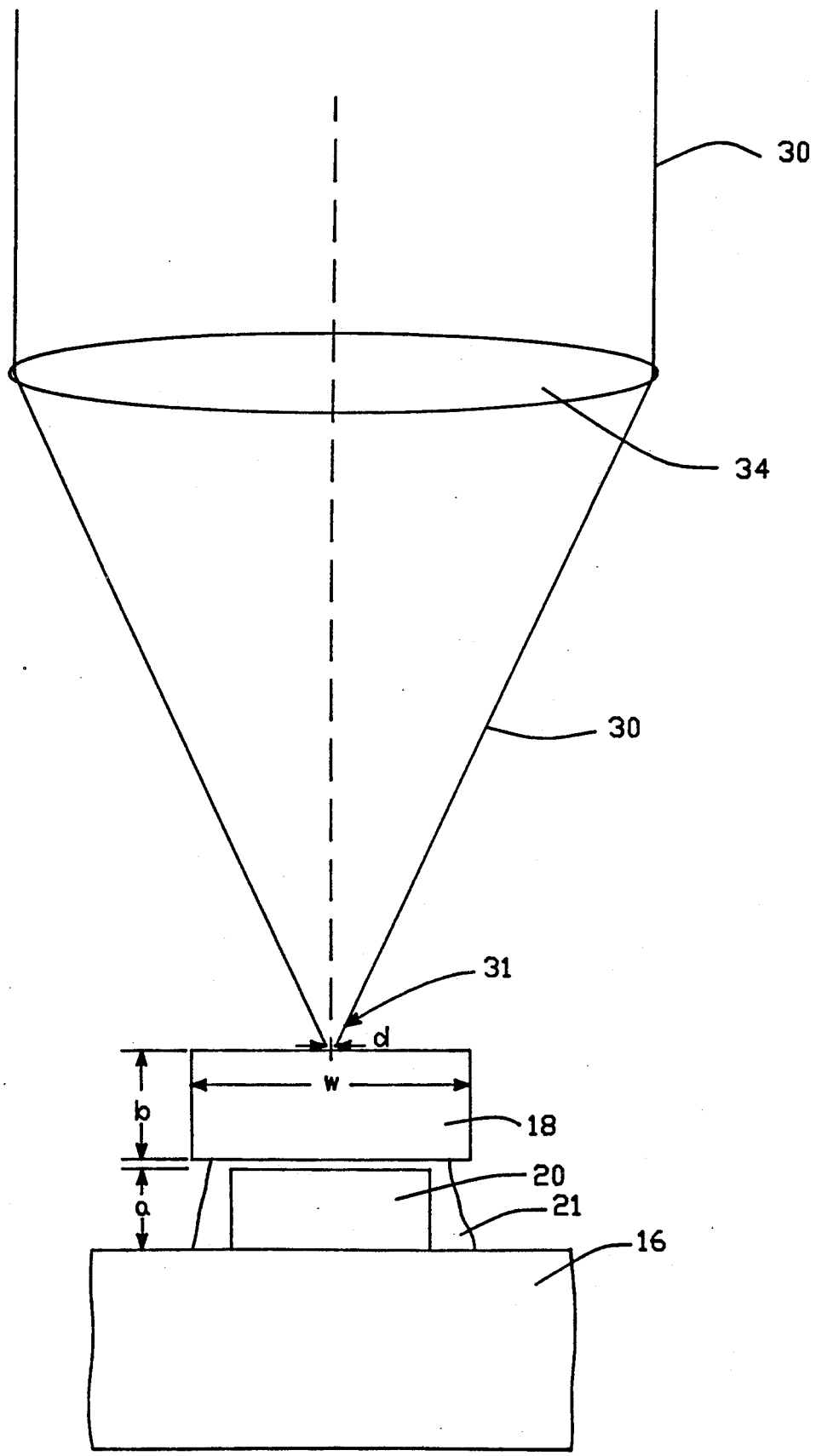
FIG. 3 is a cross-sectional view of a lead bonded to a pad of a chip for explaining a first laser excising method.

The improved lead structure of the present invention will be described with reference to FIG. 1 The tape automated bonding and laser excising methods of the present invention will be described with reference to FIGS. 2–4.

As shown in FIG. 1 one frame 10 of a tape 12—the tape 12 comprising a plurality of frames 10—has an aperture 14 provided in the center of frame 10. The shape of aperture 14 is governed by the shape of a chip (semiconductor device) 16 to which plural leads 18 are to be bonded. The leads 18 are fabricated on tape 12 by standard photolithographic processes which are known in the art. The bonding process for attaching leads 18 to contact pads 20, e.g., solder bumps, of chip 16 may be, for example, reflow soldering or other known methods.

The present invention relates to a stiffener (stiffening ring or stiffening square) 22 which is attached to leads 18 to maintain the proper spacing and orientation of the portions of leads 18 extending into aperture 14 during the process of manufacturing the leads and subsequent processing, including bonding. The portions of leads 18 on the tape 12 are supported and protected by the tape 12. In the preferred embodiment of the present invention, stiffener 22 is fabricated as an integral part of leads 18. For example, the mask utilized to expose and pattern the photoresist which defines leads 18 may be modified to include a portion corresponding to stiffener 22.

The stiffener 22 shown in FIG. 1 is a square ring; an alternate description of this structure is that a spacer is provided between each pair of adjacent leads. Stiffener 22 may be designed to have other configurations. An example of another configuration for stiffener 22 is a solid area (not shown) formed at the ends of leads 18. Stiffener 22 serves to maintain the alignment of and protect leads 18 from damage during the fabrication of the leads themselves, e.g., etching baths to remove the photoresist, and during subsequent processing, e.g., tinning or plating of leads 18 prior to bonding. Stiffener 22 can be removed from leads 18 before or after leads 18 are bonded to pads 20 in an inner-lead bonding process (for example, reflow soldering).

A second aspect of the present invention is the removal of stiffener 22 by laser excising, i.e., cutting leads 18 with a laser beam to remove the stiffener 22. A first laser excising method (FIGS. 1 and 3) involves cutting each lead 18 individually along excising line 24. This method utilizes a small diameter laser beam and avoids irradiating the chip 16 with laser beam—it may be undesirable to irradiate chip 16 with a laser beam if, for example, the chip 16 or the individual semiconductor devices (not shown) formed in or on the chip would be damaged by the laser. A second laser excising method (FIG. 4) utilizes a laser beam which is shaped so that many leads 18 can be cut simultaneously. These methods and some of the considerations associated with laser excising will be discussed below.

In a first laser excising method, described with reference to FIG. 3, each lead 18 is individually cut by a laser beam 30. A first consideration in selecting a laser for laser excising is the relationship of the wavelength of the laser light to the spot size. The laser beam 30 is focussed by lens 34 and the relationship between the wavelength of the laser and the smallest spot size which can be provided dictates the selection of a shorter wavelength laser if a small spot size is desired. This relationship is known as the diffraction limit.

One category of lasers considered for laser excising is excimer lasers, e.g., xenon, xenon chloride, or xenon fluoride lasers. Excimer lasers have a wavelength ranging from 0.193 $\mu$m to 0.506 $\mu$m; a wavelength which is absorbed by copper and which allows the beam to be highly focussed to a small spot diameter d. Prior to being focussed by lens 34, beam 30 of an excimer laser passes through an approximately 10×40 micron aperture (not shown) to shape the laser beam 30. The excimer laser may be operated, for example, at a power of 16 joules/cm$^2$ and a pulse frequency of 100 Hz. Approximately 100 pulses are required to cut each lead 18. The power and pulse frequency must be selected in accordance with many factors, including the thickness of the leads, the depth of field of the beam, the spot diameter, the type of laser and its wavelength, and the material of leads 18, in order to out leads 18 efficiently without damaging any other components such as solder bumps 20 or chip 16. Some of the factors which have been considered with respect to preventing damage to chip 16 by laser radiation are discussed below.

As shown in FIG. 3, solder bumps 20 have a thickness "a" of approximately 25-30 $\mu$m and leads 18 have a thickness "b" of approximately 75 $\mu$m. An additional thickness is added by solder 21; however, the thickness of the solder is small enough to be ignored. The depth of field is known to be approximately three (3) times the spot diameter. Therefore, the spot diameter should be less than (a+b)/3. Since it is desirable to have a depth of field of less then seventy five (75) $\mu$m, a laser having a short enough wavelength to permit a spot diameter of less than 35 $\mu$m, and preferrably on the order of 5-15 $\mu$m, must be selected. Excimer lasers can be focussed to a spot diameter of 2.3-6 $\mu$m. Argon-fluoride lasers, for example, can produce a spot having a diameter of 1-2 $\mu$m.

A small depth of field causes the laser beam 30 to be focused only in a small range in the z-direction and to be diverged from the focussing waist 31 of the beam in the z-direction. Accordingly, the laser beam 30 will be focussed or concentrated when incident on leads 18 but unfocused or diverged when incident on chip 16.

Another manner of preventing damage to chip 16 due to laser irradiation is to select a laser having a wavelength which is absorbed by the material comprising leads 18 but which is reflected by the material on the surface of chip 16. Various materials absorb different wavelengths of laser lights to different degrees, and thus it is desirable to choose a laser having a wavelength which is absorbed by leads 18 but is not highly absorbed by the underlying chip 16. Absorption of the laser by leads 18 causes heating; the highly localized heating provided by a laser melts and thus cuts leads 18.

Providing material on the surface of chip 16 which is reflective to the selected laser also serves to protect chip 16. For example, light emitted by a $CO_2$ laser, which has a wavelength of 10.6 mm, is reflected by glass but highly absorbed by silicon. Accordingly, providing a glass coating on chip 16 will protect the chip from potential damage caused by a $CO_2$ laser.

The second laser excising method will be explained with reference to FIG. 4. The second laser excising method involves cutting many leads 18 simultaneously. Laser beam 30' passes through a rectangular aperture (not shown) and is focussed by a cylindrical lens 26 into a long and narrow cutting region 38 intersecting some or all of the leads on one side of chip 16. This method is useful if the chip 16 will no be damaged by the laser; all of the factors discussed above, including the relative absorption of the leads 18 and chip 16 and the depth of field of the laser must be considered if this method is utilized to simultaneously cut multiple leads 18 after the leads 18 have been bonded (soldered) to pads 20. However, if the stiffener 22 is removed prior to bonding leads 18 to pads 20, this second method results in great time savings and the possibility of damaging chip 16 is eliminated.

Both the first and second excising methods may be performed before the leads are bonded to pads 20 as long as the leads 18 have a uniform pitch after processing and removing the stiffener 22 does not have an adverse effect on the pitch or alignment of the leads 18.

What is claimed is:

1. A tape automated bonding (TAB) method, comprising the steps of:
   providing a substrate having an aperture, a plurality of leads extending into the aperture, and a stiffener attached to the portion of the leads extending into the aperture;
   bonding the leads to a semiconductor device; and
   removing the stiffener from the leads by irradiating each lead with a laser beam having a spot diameter which is less than one third of the distance between the focal point of the laser beam and the semiconductor device.

2. A TAB method according to claim 1, wherein said removing step is performed after bonding step.

3. A TAB method according to claim 1, wherein said removing step is performed before said bonding step.

4. A TAB method according to claim 1, wherein said removing step comprises irradiating the leads with a laser beam having a wavelength which is more readily absorbed by the leads than by the semiconductor device.

5. A TAB method according to claim 1, further comprising the step of providing a coating on the semiconductor device which is reflective to the laser beam prior to said removing step.

6. A tape automated bonding (TAB) method, comprising the steps of:
   providing a substrate having an aperture, a plurality of leads extending into the aperture, and a stiffener attached to the portion of the leads extending into the aperture;
   bonding the leads to a semiconductor device; and
   removing the stiffener from the leads by focussing a laser beam on the leads so that the depth of field of the laser beam is less than the distance between the focal point and the semiconductor device.

7. A TAB method according to claim 6, wherein said removing step is performed after bonding step.

8. A TAB method according to claim 6, wherein said removing step is performed before said bonding step.

9. A TAB method according to claim 6, wherein said removing step comprises irradiating the leads with a laser beam having a wavelength which is more readily absorbed by the leads than the semiconductor device.

10. A TAB method according to claim 6, further comprising the step of providing a coating on the semiconductor device which is reflective to the laser beam prior to said removing step.

11. A process for tape automated bonding (TAB) bonding of leads to bonding pads of a semiconductor device, the bonding pads having a thickness x above the surface of the semiconductor device, comprising the steps of:
   providing a tape having a first surface facing the semiconductor device, a second surface facing away from the semiconductor device, a thickness y between the first and second surfaces, an aperture, a plurality of leads extending into the aperture, and a stiffener attached to the portion of the leads extending into the aperture;
   bonding the leads to the bonding pads of a semiconductor device; and
   cutting the stiffener from the leads by focussing a laser beam on the first surface of the leads, the laser beam having a spot diameter which is less than approximately $(x+y)/3$ and having a depth of field less than approximately y.

12. A method according to claim 11, wherein said cutting step comprises focussing a laser beam having a wavelength of less than approximately 0.5 microns on the leads.

13. A method according to claim 11, wherein said cutting step comprises focussing a laser beam having a wavelength of approximately 0.19 microns to approximately 0.51 microns on the leads.

14. A method according to claim 11, wherein said cutting step comprises focussing an excimer laser beam on the leads.

15. A process for tape automated bonding (TAB) bonding of leads to bonding pads of a semiconductor device, the bonding pads extending a distance x above the surface of the semiconductor device, comprising the steps of:
   (a) providing a tape having a first surface facing the semiconductor device, a second surface facing away from the semiconductor device, a thickness y between the first and second surfaces, an aperture, a plurality of leads extending into the aperture, and a stiffener attached to the portion of the leads extending into the aperture;
   (b) aligning the leads with the bonding pads of the semiconductor device;
   (c) soldering the leads to the bonding pads after said step (b);
   (d) providing a beam of laser light having a wavelength of approximately 0.19 microns to approximately 0.51 microns, a power of approximately 10–20 joules per square centimeter and a pulse frequency of approximately 75–100 Hz;
   (e) passing the beam of laser light through a collimating aperture;
   (f) focussing the beam of laser light on the first surface of a lead over the surface of the semiconductor device so that the laser beam has a spot diameter which is less than approximately 15 microns and has a depth of field less than approximately y; and
   (h) pulsing the laser beam until the lead is severed.

* * * * *